(12) United States Patent
Strachan et al.

(10) Patent No.: US 6,548,839 B1
(45) Date of Patent: Apr. 15, 2003

(54) LDMOS TRANSISTOR STRUCTURE USING A DRAIN RING WITH A CHECKERBOARD PATTERN FOR IMPROVED HOT CARRIER RELIABILITY

(75) Inventors: Andrew Strachan, Santa Clara, CA (US); Douglas Brisbin, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/079,093

(22) Filed: Feb. 20, 2002

(51) Int. Cl.[7] ............................................... H01L 27/10
(52) U.S. Cl. .................. 257/204; 257/341; 257/776
(58) Field of Search ................................ 257/204, 341, 257/401, 776, 758, 773

(56) References Cited

U.S. PATENT DOCUMENTS 5,355,008 A * 10/1994 Moyer et al. ............... 257/341

OTHER PUBLICATIONS

"Hot–Carrier Reliability and Design of N–LDMOS Transistor Arrays"; Douglas Brisbin, Andy Strachan, and Prasad Chaparala; National Semiconductor Corporation; pp. 19–23.

* cited by examiner

*Primary Examiner*—Carl Whitehead, Jr.
*Assistant Examiner*—Yennhu B. Huynh
(74) *Attorney, Agent, or Firm*—Stallna & Pollock LLP

(57) ABSTRACT

An LDMOS array includes an array of alternating source regions and drain regions formed in a semiconductor substrate to define a checkerboard pattern of source and drain regions. A source contact is formed in electrical contact with each of the source regions in the array to connect the source regions in parallel. A drain contact is formed in electrical contact with each of the drain regions in the array to connect the drain regions in parallel. A drain ring is formed around the periphery of the checkerboard pattern and in electrical contact with the drain contact, providing redistribution of the current flow within the LDMOS array and thereby allowing safer hot carrier operation at higher biases than with the conventional layout.

9 Claims, 7 Drawing Sheets

LDMOS TRANSISTOR STRUCTURE USING A DRAIN RING WITH A CHECKERBOARD PATTERN FOR IMPROVED HOT CARRIER RELIABILITY

BACKGROUND OF THE INVENTION

1. Field of the Invention

The present invention relates to integrated circuit (IC) power management control devices and, in particular, to the utilization of a ring of drain contact around the outer periphery of a lateral DMOS (LDMOS) transistor array to improve the degradation of on-resistance with time due to hot electrons.

2. Discussion of the Related Art

As discussed by Brisbin, Strachan and Chaparala, "Hot-Carrier Reliability and Design of N-LDMOS Transistor Arrays", 2001 IEEE International Integrated Reliability Workshop Final Report, Oct. 15–18, 2001, the increase in handheld and portable appliances operating in the 20–30V range has driven the need for IC power management control devices. These power management circuits typically combine high performance CMOS and bipolar transistors with a power MOS driver. The LDMOS is a common choice for the driver transistor. The above-cited Brisbin et al. publication is hereby incorporated by reference in its entirety to provide additional background information regarding the present invention.

LDMOS transistors are typically used at high currents and voltages, e.g., 24 V and 2 A/mm$^2$. Under these conditions, hot electron effects occur, causing degradation of device parameters such as threshold voltage, gain and on-resistance, as discussed in detail in the above-cited Brisbin et al. publication. For LDMOS transistors, the parameter most susceptible to hot electron effects is the on-resistance.

As shown in FIG. 1, a conventional LDMOS array 100 is laid out as alternating source 102 and drain 104 regions formed in a semiconductor (e.g., silicon) substrate in a checkerboard pattern. All of the source regions 102 are connected in parallel, utilizing metal (e.g. Al) straps, as are all of the drain regions 104, to form one large LDMOS transistor. The array 100 is typically surrounded by an isolation mechanism 106 such as trench isolation oxide, polyfill trench isolation or junction isolation. As stated above, the array is stressed under constant drain voltage and drain current conditions such as 24 V and 2 A/mm$^2$. The time taken for the on-resistance to shift by a specified amount, e.g., 10%, is defined as the hot electron lifetime of the array.

SUMMARY OF THE INVENTION

The present invention provides an LDMOS transistor array architecture that significantly improves the hot electron lifetime of the device.

The improvement is due to the addition of a drain contact ring formed around the periphery of a conventional LDMOS transistor array. Utilization of the peripheral drain ring causes redistribution of the current flow within the LDMOS array, allowing safer operation at higher biases than with the conventional layout.

Additional features and advantages of the present invention will become apparent upon review of the following detailed description and accompanying drawings that set forth an illustrative embodiment in which the principles of the invention are utilized.

DETAILED DESCRIPTION OF THE INVENTION

The present invention adds a drain ring to the periphery of an LDMOS transistor array to improve the hot electron lifetime of the LDMOS array. Simulations and measurements show that the drain ring effectively reduces the current density at the center of the array while reducing the electric field at the edge of the array, thereby improving the hot electron lifetime of the drain edge array versus the conventional layout.

Figure 1:
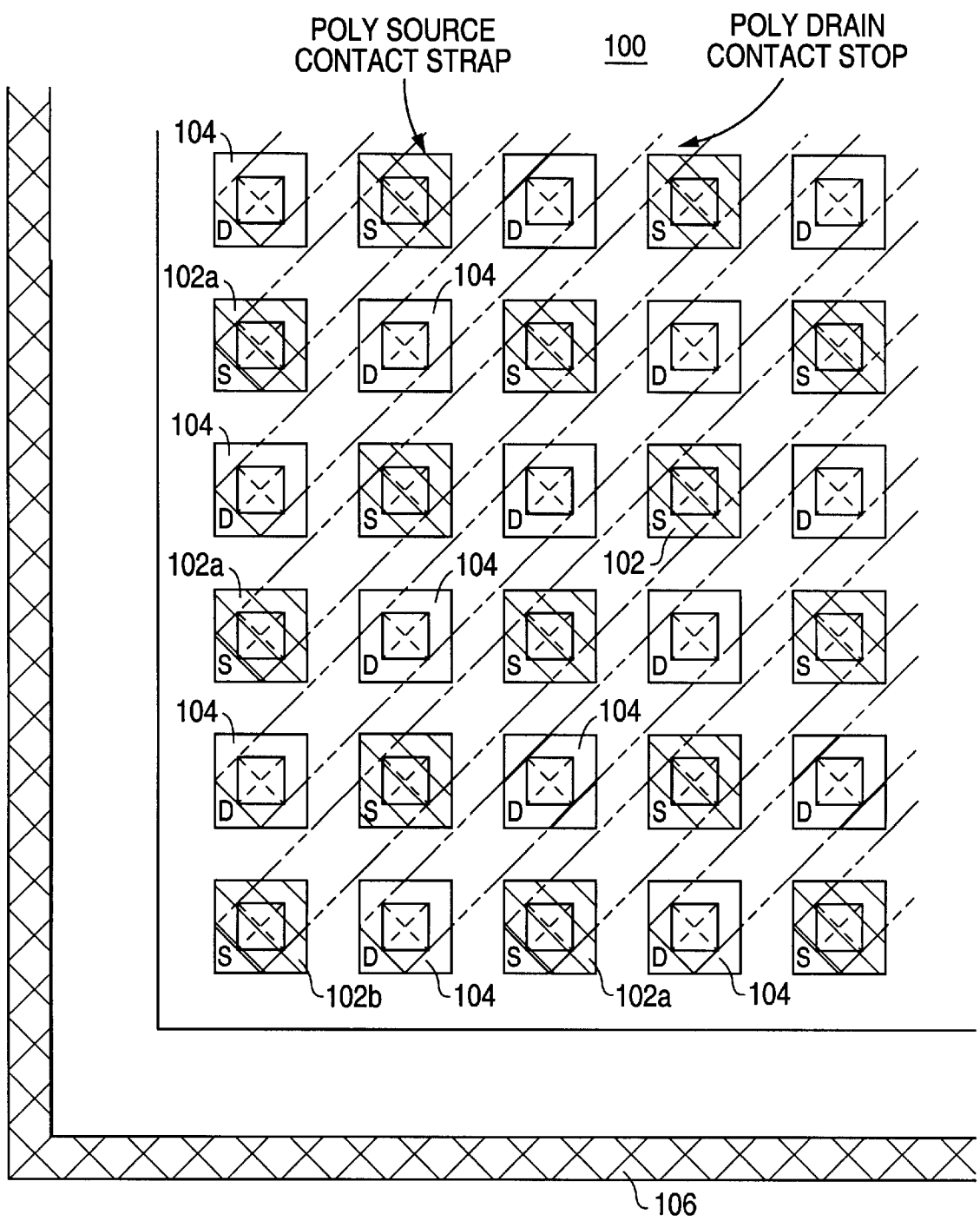
FIG. 1 displays the corner portion layout of a conventional LDMOS transistor array.
Figure 1A:
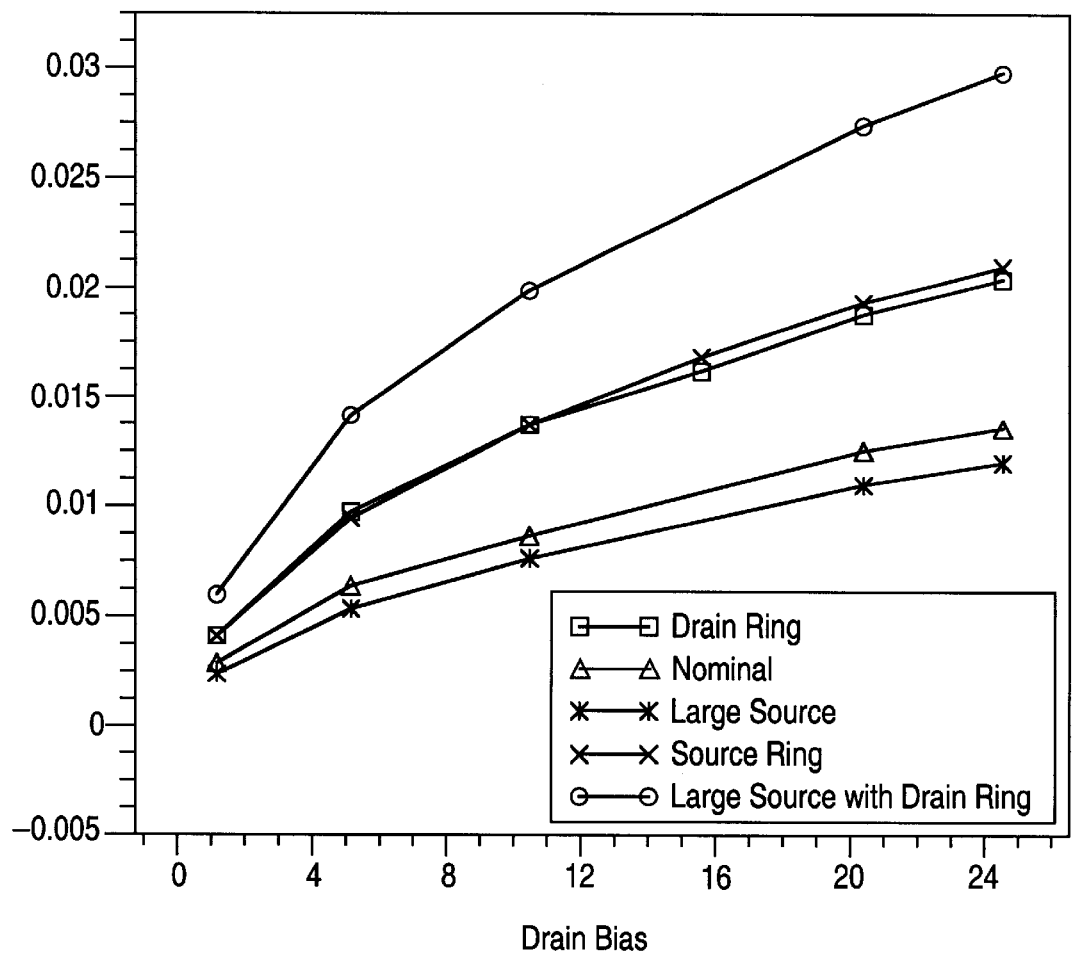
FIG. 1a shows simulation results of total drain current for various LDMOS array layouts versus Vds.

FIG. 1 shows that, in the conventional checkerboard LDMOS array 100, the edge source regions 102a have only three adjacent drain regions 104; corner source regions 102b have only two adjacent drain regions 104. It might be expected, therefore, that the corner source regions 102b would conduct 0.5 times the current of a source region 102 formed in the center of the array 100. However, the attached FIGS. 1a and 1b simulation results show that the corner source regions 102 conduct approximately 0.8 times the current conducted by the center source regions 102. These results show considerable current flows from source to drain around the periphery of the array 100.

Figure 2:
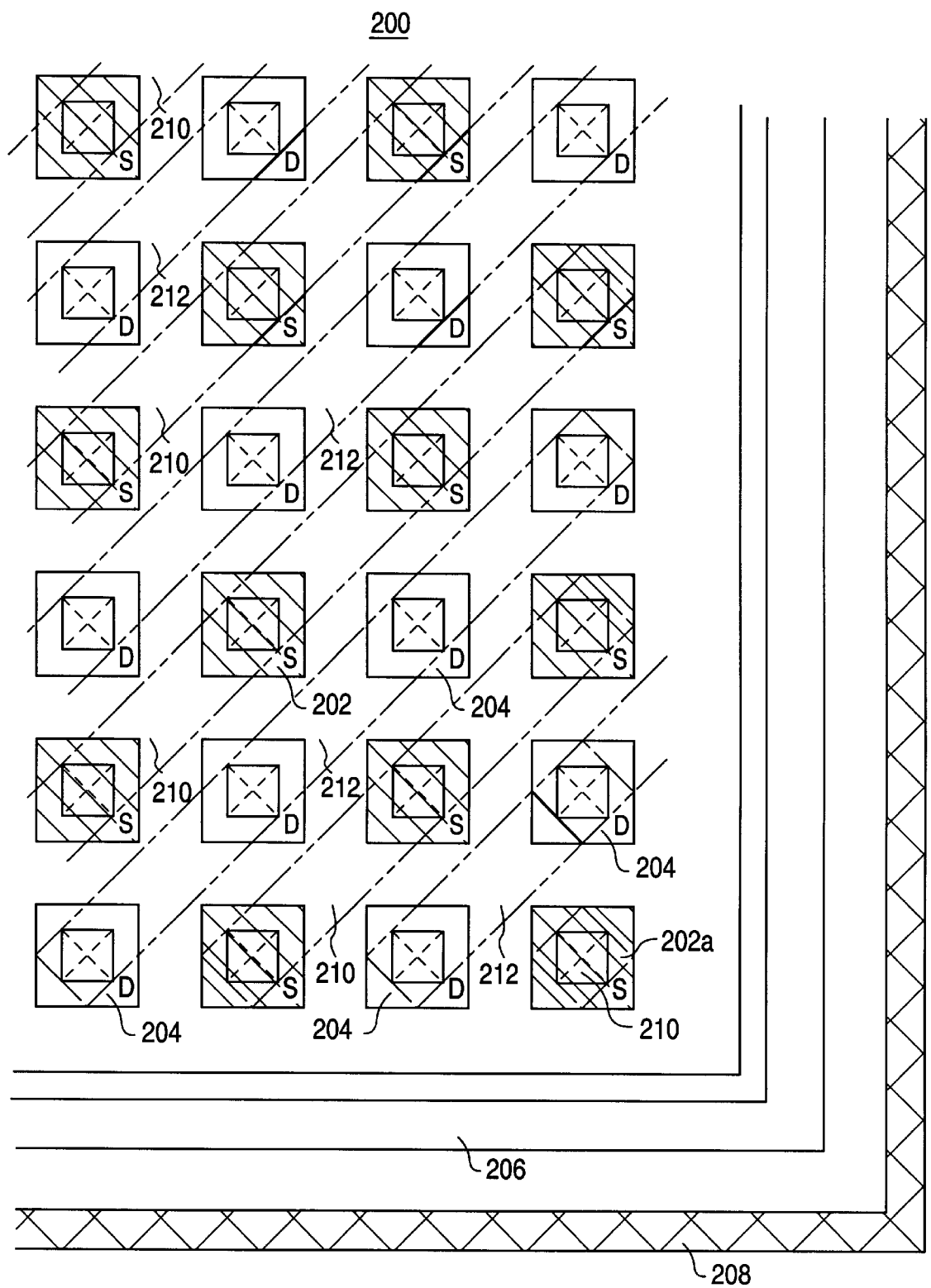
FIG. 2 shows a layout of a corner portion of a LDMOS transistor array in accordance with the present invention.

FIG. 2 displays an LDMOS transistor array 200 in accordance with the present invention. The LDMOS transistor array includes alternating, spaced-apart source regions 202 and drain regions 204 of a first conductivity type (e.g., N-type) formed in a silicon substrate to form a checkerboard pattern structure. The structure of this portion of the LDMOS array can be similar to that disclosed in the above-cited Brisbin et al. publication. In accordance with the present invention, a drain ring 206 of the first conductivity type (e.g., N-type) is formed in the substrate around the periphery of the source/drain checkerboard pattern. FIG. 2 also shows an isolation structure formed in the substrate around the drain ring 206; those skilled in the art will appreciate that the isolation structure can be, for example, a ring of trench isolation oxide 208, polyfill trench isolation, junction isolation, or any other isolation mechanism utilized in the art. All of the source regions 202 are connected in parallel utilizing a conductive, preferably metal (e.g. Al), source interconnect structure 210. Similarly, all of the drain regions 204 are connected in parallel utilizing a conductive, preferably metal (e.g. Al), drain interconnect structure 212. In one embodiment, the drain interconnect structure 212 is also connected to the drain ring 206.

Alternatively, the drain ring 206 is not shorted to the other drain regions 204. In this case, the drain ring 206 is biased separately from the rest of the drain regions 204. It also may be useful to bias the drain ring 206 to a different voltage than the other drain regions 204.

Those skilled in the art will appreciate that the LDMOS transistor array structure 200 can be fabricated in accordance with well-known semiconductor integrated circuit manufacturing techniques, which need not be described in detail herein.

Figure 1B:
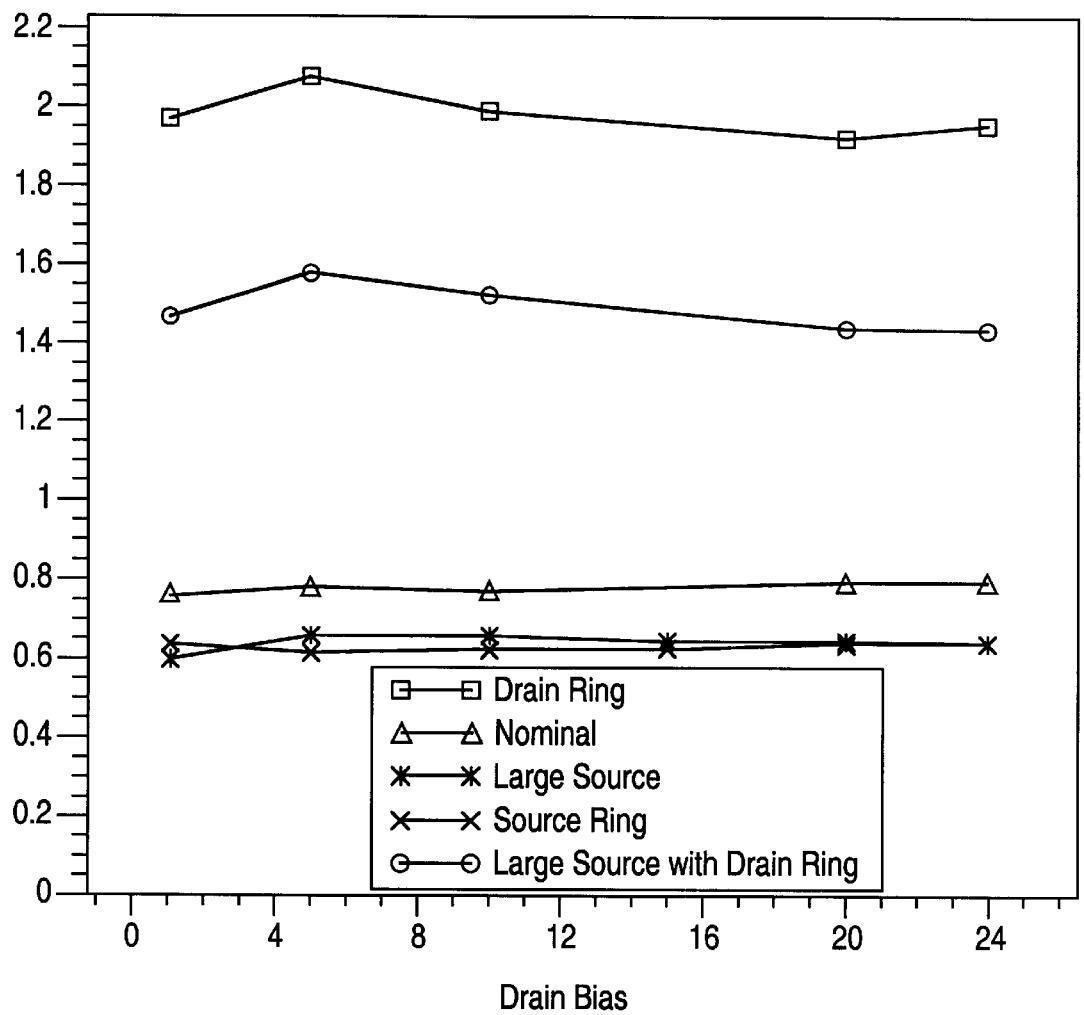
FIG. 1b shows simulation results of the ratio of current from a corner source region as compared to a center source region for various LDMOS array layouts.

From a geometric point of view, the addition of a drain ring 206 might be expected to make all source regions 202 conduct equal current since, now, all source regions 202 can conduct to drains in all four directions. Simulation results provided in FIG. 1b show that the drain ring 206 contributes to the current sinking by a greater amount than expected biased on geometric considerations. In fact, the corner source regions 202a now conducts almost 2 times the current of a center source region 202. This is due to the lack of current crowding at the drain ring 206.

Since the hot electron testing and actual device operation requires a constant drain current, the increase in conduction by the edge source regions leads to an overall drop in current carried by center source cells. In short, the array with a drain ring 206 has a higher current conduction at the array edge and a lower current in the array center, whereas conventional cell design has higher current conduction in the array center and lower current conduction at the edge.

Figure 3A:
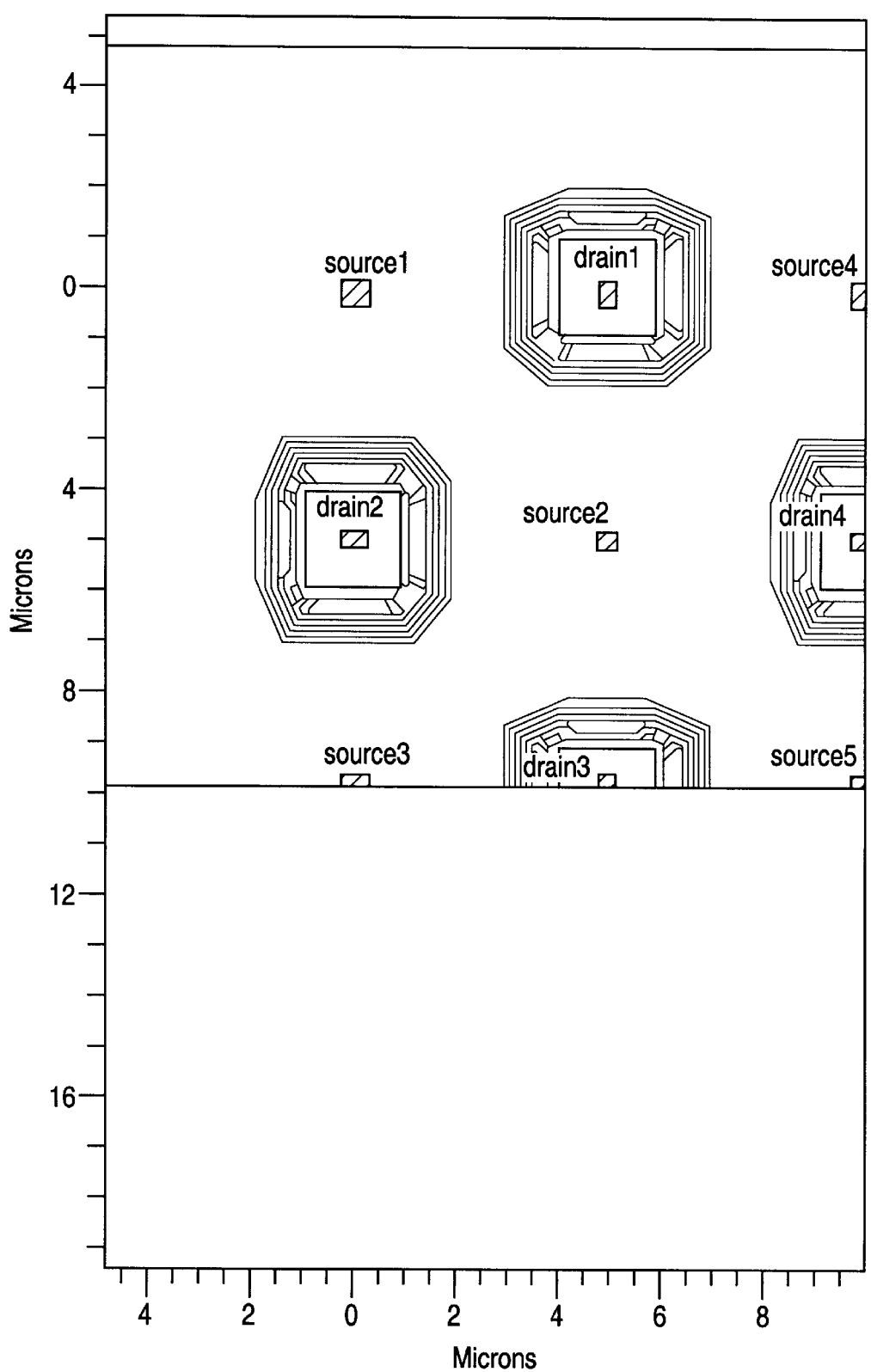
FIGS. 3a and 3b provide a comparison of the electric field contours for a conventional LDMOS array structure and a drain ring LDMOS array structure in accordance with the present invention, respectively.
Figure 3B:
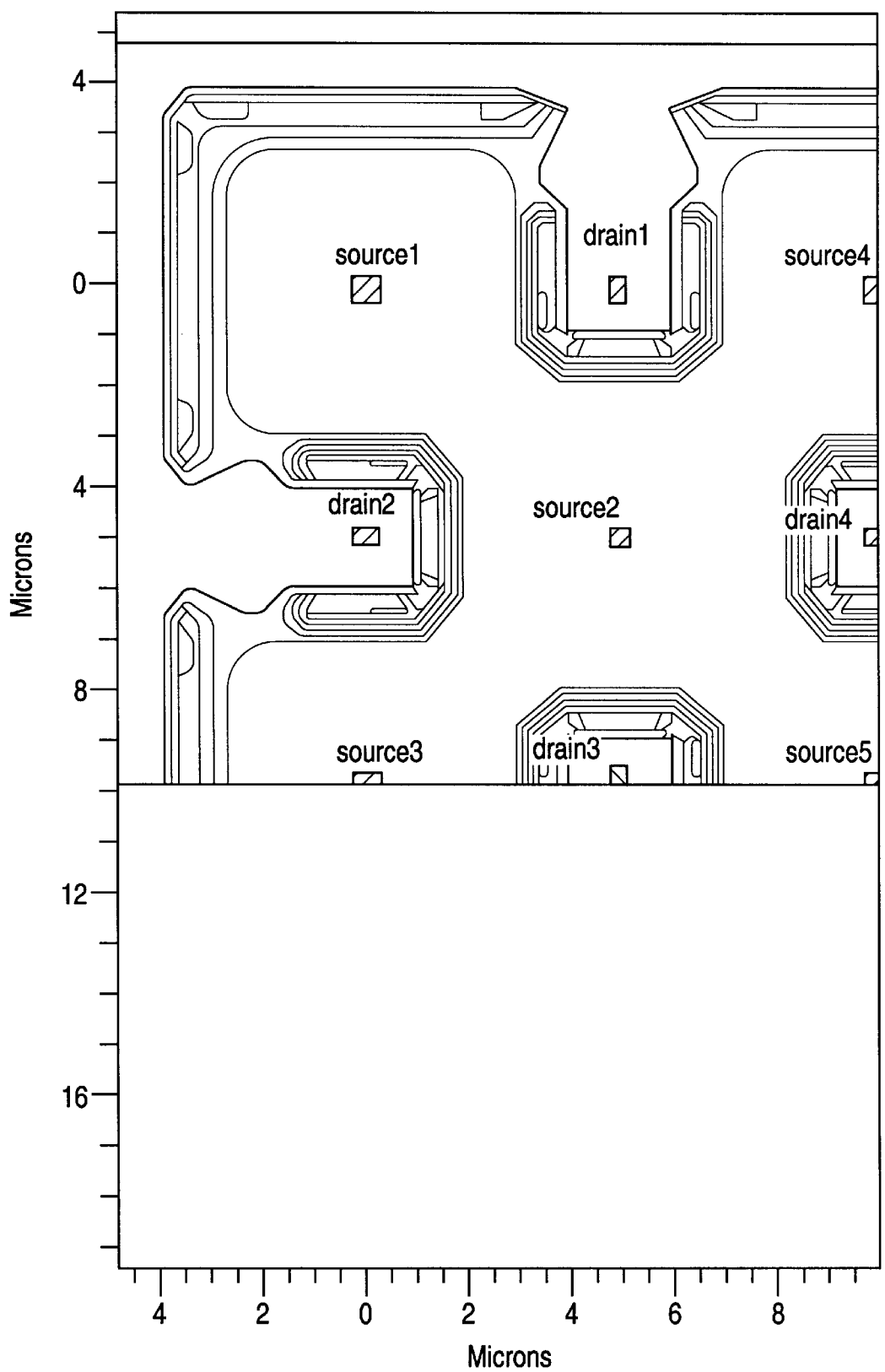

The other factor to the improvement in hot carrier lifetime is the electric field distribution. Simulations show that the electric field at the edge of the array is lower than for any of the center cells. One way to illustrate this is to simulate and plot the function that is closest to impact ionization rate: (current density)*exp (−) Ec/electric field)), where Ec is critical electric field (i.e., constant). As shown in FIGS. 3a and 3b, our simulations show that the drain ring structure shown in FIG. 2 has much lower values of this function at the drain edge than the conventional array show in FIG. 1. This leads to less impact ionization at the drain edge and, therefore, less hot carrier degradation on-resistance.

Figure 4:
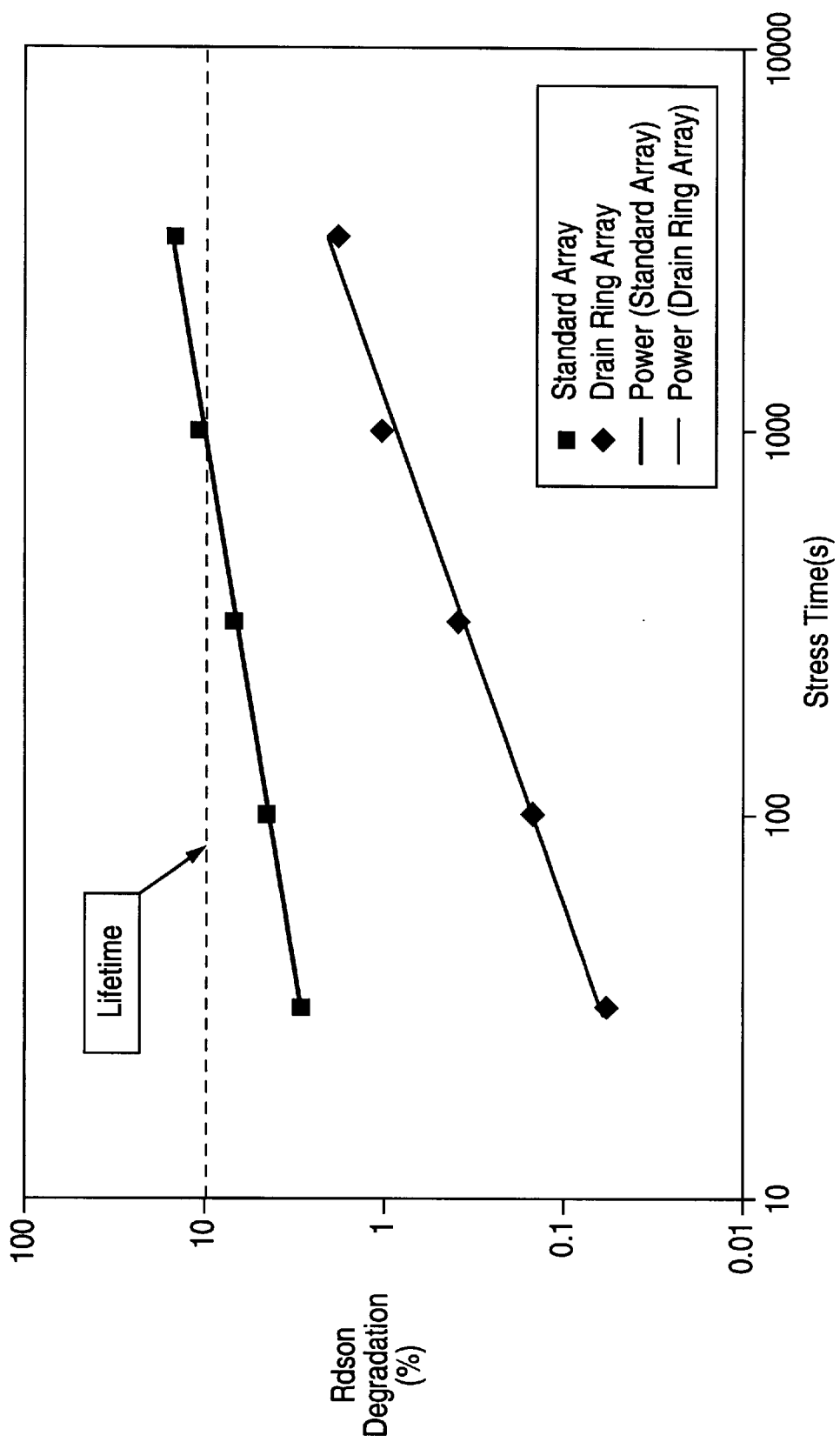
FIG. 4 compares hot electron degradation of on-resistance for a conventional LDMOS array versus an LDMOS array in accordance with the present invention, for a 30 V LDMOS technology.

FIG. 4 compares measured hot electron on-resistance degradation of a conventional array versus the drain edge array for a 30 V LDMOS technology. Results show that the drain edge array has a much higher hot electron on-resistance lifetime than the conventional array at the same bias conditions.

It should be understood that variations to the embodiments of the invention described above may be employed in practicing the invention. It is intended that the following claims define the scope of the invention and that methods and structures within the scope of these claims and their equivalents be covered thereby.

What is claimed is:

1. An LDMOS transistor array structure comprising:
   an array that includes a plurality of alternating source regions and a plurality of alternating drain regions formed in a semiconductor substrate to define a checkerboard pattern of said alternating source and drain regions;
   a conductive source interconnect structure formed in electrical contact with each of the plurality of source regions in the array to electrically connect said source regions in parallel;
   a conductive drain interconnect structure formed in electrical contact with each of the plurality of drain regions in the array to electrically connect said drain regions in parallel; and
   a drain ring structure formed in the semiconductor substrate around and spaced apart from the periphery of the checkerboard pattern.

2. An LDMOS transistor array structure as in claim 1, and wherein the drain ring structure is electrically isolated from the plurality of alternating drain regions.

3. An LDMOS transistor array structure as in claim 1, and further comprising:
   an isolation structure formed in the semiconductor substrate around the periphery of the drain ring structure.

4. An LDMOS transistor array structure as in claim 3, and wherein the isolation structure comprises an oxide-filled trench formed spaced-apart from the drain ring structure.

5. An LDMOS transistor array structure comprising:
   an array that includes a plurality of alternating spaced-apart source regions of a first conductivity type and a plurality of alternating space-apart drain regions of the first conductivity formed in a semiconductor substrate having a second conductivity type opposite the first conductivity type to define a checkerboard pattern of said spaced-apart source and drain regions;
   a conductive source interconnect structure formed in electrical contact with each of the plurality of source regions in the array to electrically connect the source regions in parallel; and
   a drain ring structure of the first conductivity type formed in the semiconductor substrate around the periphery of and spaced-apart from the checkerboard pattern.

6. An LDMOS transistor array structure as in claim 5, and further comprising:
   a conductive drain region interconnect structure formed in electrical contact with each of the plurality of drain regions and with the drain ring structure to electrically connect the drain regions and the drain ring structure in parallel.

7. An LDMOS transistor array structure as in claim 5, and further comprising:
   a conductive drain interconnect structure formed in electrical contact with each of the plurality of drain regions to electrically connect the drain regions in parallel; and
   a conductive drain ring contact structure formed in electrical contact with the drain ring and electrically insulated from the drain region contact structure.

8. An LDMOS transistor array structure as in claim 7, and wherein:
   the drain region contact structure is connected to receive a first bias voltage;
   the drain ring contact structure is connected to receive a second bias voltage that is different than the first bias voltage.

9. An LDMOS transistor array structure as in claim 5, and wherein the first conductivity type is N-type.

* * * * *